United States Patent
Lee et al.

(10) Patent No.: US 8,410,477 B2
(45) Date of Patent: Apr. 2, 2013

(54) ORGANIC LIGHT EMITTING DEVICE, LIGHTING APPARATUS AND ORGANIC LIGHT EMITTING DISPLAY APPARATUS

(75) Inventors: Sung-Hun Lee, Yongin (KR); Gwan-Hyoung Lee, Yongin (KR); Chang-Woong Chu, Yongin (KR); Seung-Hyup Yoo, Daejeon-si (KR); Tae-Wook Koh, Daejeon-si (KR); Jung-Min Choi, Jecheon-si (KR)

(73) Assignees: Samsung Display Co., Ltd., Yongin-si (KR); Korean Advanced Institute of Science and Technology, Daejeon (KR)

( * ) Notice: Subject to any disclaimer, the term of this patent is extended or adjusted under 35 U.S.C. 154(b) by 292 days.

(21) Appl. No.: 12/952,348

(22) Filed: Nov. 23, 2010

(65) Prior Publication Data
US 2011/0121272 A1    May 26, 2011

(30) Foreign Application Priority Data

Nov. 24, 2009  (KR) .................. 10-2009-0114061

(51) Int. Cl.
*H01L 51/52* (2006.01)
(52) U.S. Cl. .................. 257/40; 257/E51.019
(58) Field of Classification Search .............. 257/40, 257/E51.019
See application file for complete search history.

(56) References Cited

U.S. PATENT DOCUMENTS

| | | | |
|---|---|---|---|
| 2004/0080264 A1* | 4/2004 | Ichikawa | 313/501 |
| 2006/0071233 A1 | 4/2006 | Cho et al. | |
| 2006/0246620 A1 | 11/2006 | Nagayama et al. | |
| 2008/0100202 A1* | 5/2008 | Cok | 313/503 |
| 2008/0238310 A1 | 10/2008 | Forrest et al. | |
| 2008/0265757 A1 | 10/2008 | Forrest et al. | |
| 2008/0284320 A1 | 11/2008 | Karkkainen | |
| 2010/0181899 A1* | 7/2010 | Forrest et al. | 313/504 |
| 2011/0180836 A1* | 7/2011 | Son | 257/98 |

FOREIGN PATENT DOCUMENTS

| | | |
|---|---|---|
| JP | 10-223367 | 8/1998 |
| JP | 2002-56968 | 2/2002 |
| JP | 2002-56988 | 2/2002 |
| KR | 10-2006-0030396 | 4/2006 |
| KR | 10-0794612 | 1/2008 |

OTHER PUBLICATIONS

Yiru Sun et al., "Enhanced light out-coupling of organic light-emitting devices using embedded low-index grids," Nature Photonics, vol. 2, Aug. 2008.

* cited by examiner

*Primary Examiner* — Trung Q Dang
(74) *Attorney, Agent, or Firm* — Christie, Parker & Hale, LLP

(57) ABSTRACT

An organic light emitting device having increased outcoupling efficiency, a lighting apparatus including the organic light emitting device, and an organic light emitting display apparatus including the organic light emitting device. The organic light emitting device includes a substrate, a first electrode layer that is uniformly patterned on the substrate, a low refractive conductive layer disposed on the first electrode layer, and having a conductive material with a lower refractive index than a refractive index of an organic layer that is disposed on the low refractive conductive layer, and a second electrode layer formed on the organic layer.

34 Claims, 7 Drawing Sheets

ORGANIC LIGHT EMITTING DEVICE, LIGHTING APPARATUS AND ORGANIC LIGHT EMITTING DISPLAY APPARATUS

CROSS-REFERENCE TO RELATED APPLICATION

This application claims the benefit of Korean Patent Application No. 10-2009-0114061, filed Nov. 24, 2009 in the Korean Intellectual Property Office, the disclosure of which is incorporated herein by reference.

BACKGROUND

1. Field

Aspects of the present invention relate to an organic light emitting device, a lighting apparatus including the organic light emitting device, and an organic light emitting display apparatus including the organic light emitting device, and more particularly, to an organic light emitting device having an increased outcoupling efficiency, a lighting apparatus including the organic light emitting device, and an organic light emitting display apparatus including the organic light emitting device.

2. Description of the Related Art

An organic light emitting device includes an organic emissive layer disposed between electrodes that are opposite to each other. An electron generated by one electrode and a hole generated by the other electrode are recombined in the organic emissive layer. At this time, emissive molecules of the organic emissive layer are excited by the recombination. Then, the emissive molecules revert back to a ground state while simultaneously light is emitted.

Generally, light emitted from the organic emissive layer of the organic light emitting device has no predetermined directivity. Light is emitted in random directions having a statistically homogeneous angular distribution. Thus, a ratio of the actual number of photons reaching an observer to the total number of photons generated by the organic emissive layer of the organic light emitting device (that is, outcoupling efficiency ($\eta_{out}$)) may vary according to refractive indexes of layers included in the organic light emitting device, but is no more than about 15 to 20%.

The outcoupling efficiency of an organic light emitting device limits overall quantum efficiency (EQE) and power efficiency of the organic light emitting device. The EQE and power efficiency are factors used to determine overall power consumption and lifetime of the organic light emitting device. Therefore, various efforts to increase the outcoupling efficiency have been made.

SUMMARY

Aspects of the present invention provides an organic light emitting device having an increased outcoupling efficiency, a lighting apparatus including the organic light emitting device, and an organic light emitting display apparatus including the organic light emitting device.

According to an aspect of the present invention, there is provided an organic light emitting device including a substrate, a first electrode layer that is uniformly patterned on the substrate, a low refractive conductive layer disposed on the first electrode layer, and including a conductive material with a lower refractive index than a refractive index of an organic layer, the organic layer disposed on the low refractive conductive layer, and a second electrode layer formed on the organic layer.

According to n aspect of the invention, at least one of the first electrode layer and the second electrode layer may include a transparent electrode.

According to an aspect of the invention, a periodic interval of a pattern of the first electrode layer may be greater than a wavelength of light emitted from the organic light emitting device.

According to an aspect of the invention, a taper angle between an end of a pattern of the first electrode layer and a surface of the substrate may be in the range of about 15 to about 90 degrees.

According to an aspect of the invention, a taper angle between an end of a pattern of the first electrode layer and a surface of the substrate may be in the range of about 20 to about 70 degrees.

According to an aspect of the invention, a pattern of the first electrode layer may include a first pattern portion formed from an upper surface of the substrate to have a first thickness, and a second pattern portion etched from an upper surface of the first pattern portion towards the substrate so as to have a second thickness, wherein the first pattern portion and the second pattern portion may be uniformly arranged.

According to an aspect of the invention, a periodic interval between the first pattern portion and the second pattern portion may be greater than a wavelength of light emitted from the organic light emitting device.

According to an aspect of the invention, a taper angle between an end of the second pattern portion and a surface of the first pattern portion may be in the range of about 15 to about 90 degrees.

According to an aspect of the invention, a taper angle between an end of the second pattern portion and a surface of the first pattern portion may be in the range of about 20 to about 70 degrees.

According to an aspect of the invention, as a ratio of the second thickness to the first thickness is increased, a range of the taper angle may be increased.

According to an aspect of the invention, the low refractive conductive layer may be transparent.

According to an aspect of the invention, the low refractive conductive layer may have a high work function.

According to an aspect of the invention, the low refractive conductive layer may include at least one selected from the group consisting of Poly(3,4-ethylenedioxythiophene) poly(styrenesulfonate) (PEDOT:PSS), polyaniline, carbon nano tubes, and graphene.

According to an aspect of the invention, the organic light emitting device may further include a microlens array (MLA) disposed on an external surface of the substrate.

According to an aspect of the invention, the MLA may have at least one shape selected from the group consisting of a hemispherical shape, a pyramid shape and an inverted-trapezoid shape.

According to aspect of the invention, the MLA may have a pattern having a periodic interval.

According to an aspect of the invention, a size or periodic interval of the MLA may be greater than a wavelength of light emitted from the organic light emitting device.

According to an aspect of the invention, the MLA may include at least one material selected from the group consisting of an oxide, a nitride, a silicon compound and a polymer organic material, which are transparent to visible rays.

According to an aspect of the invention, the MLA may be formed of a material having the same refractive index as a refractive index of the substrate.

According to an aspect of the invention, the substrate may have a greater refractive index than a refractive index of a sodalime-based substrate.

According to an aspect of the invention, a refractive index of the substrate may be in the range of about 1.5 to about 2.4.

According to another aspect of the present invention, there is provided a lighting apparatus including the above organic light emitting device.

According to another aspect of the present invention, there is provided an organic light emitting display apparatus including the above organic light emitting device.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
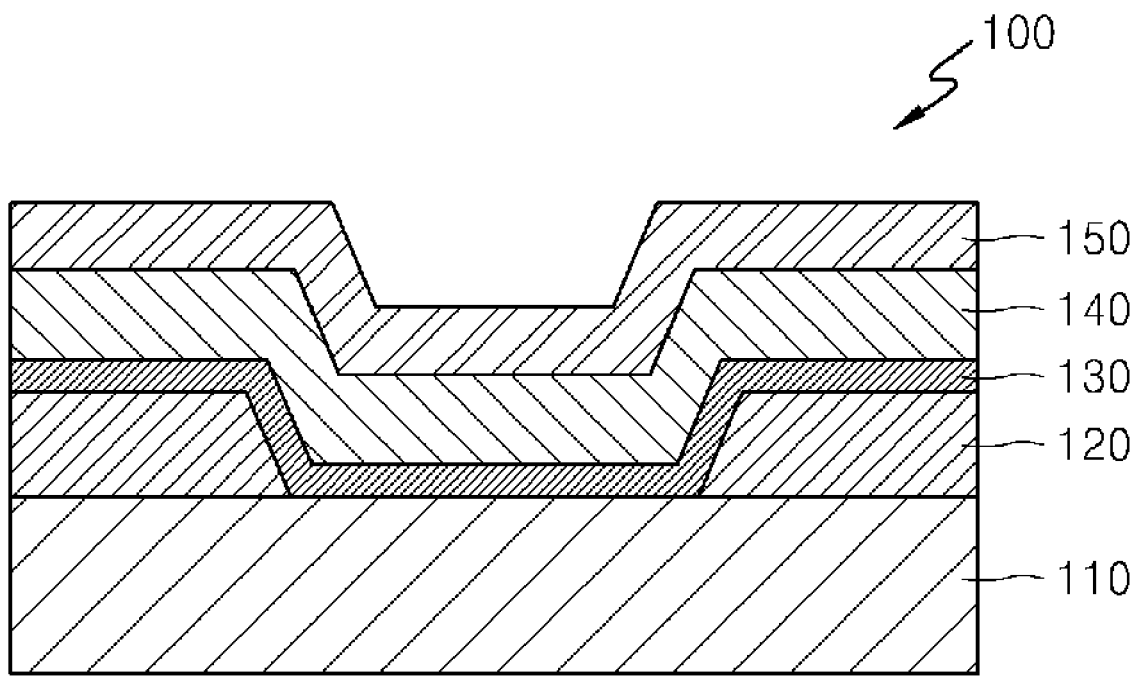
FIG. 1 is a cross-sectional view of an organic light emitting device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a cross-sectional view of an organic light emitting device 100 according to an embodiment of the present invention. Referring to FIG. 1, the organic light emitting device 100 includes a substrate 110, a first electrode layer 120, a low refractive conductive layer 130, an organic layer 140, and a second electrode layer 150.

An example of the substrate 110 may include various substrates, such as a glass substrate mainly formed of silicon dioxide ($SiO_2$), and a plastic substrate. The organic light emitting device 100 may be used in a top emission type device in which light is emitted towards the second electrode layer 150, a bottom emission type in which light is emitted towards the substrate 110, or a double-side emission type device. However, in FIG. 1, a case where the organic light emitting device 100 is used in a bottom emission type device will be described. In this case, the substrate 110 is transparent.

According to the shown example, the substrate 110 is a sodalime-based substrate in order to improve outcoupling efficiency of the organic light emitting device 100.

The first electrode layer 120 is uniformly patterned and is disposed on the substrate 110. The first electrode layer 120 is a transparent electrode formed of indium tin oxide having a refractive index of about 1.8, but the present invention is not limited thereto.

Figure 2:
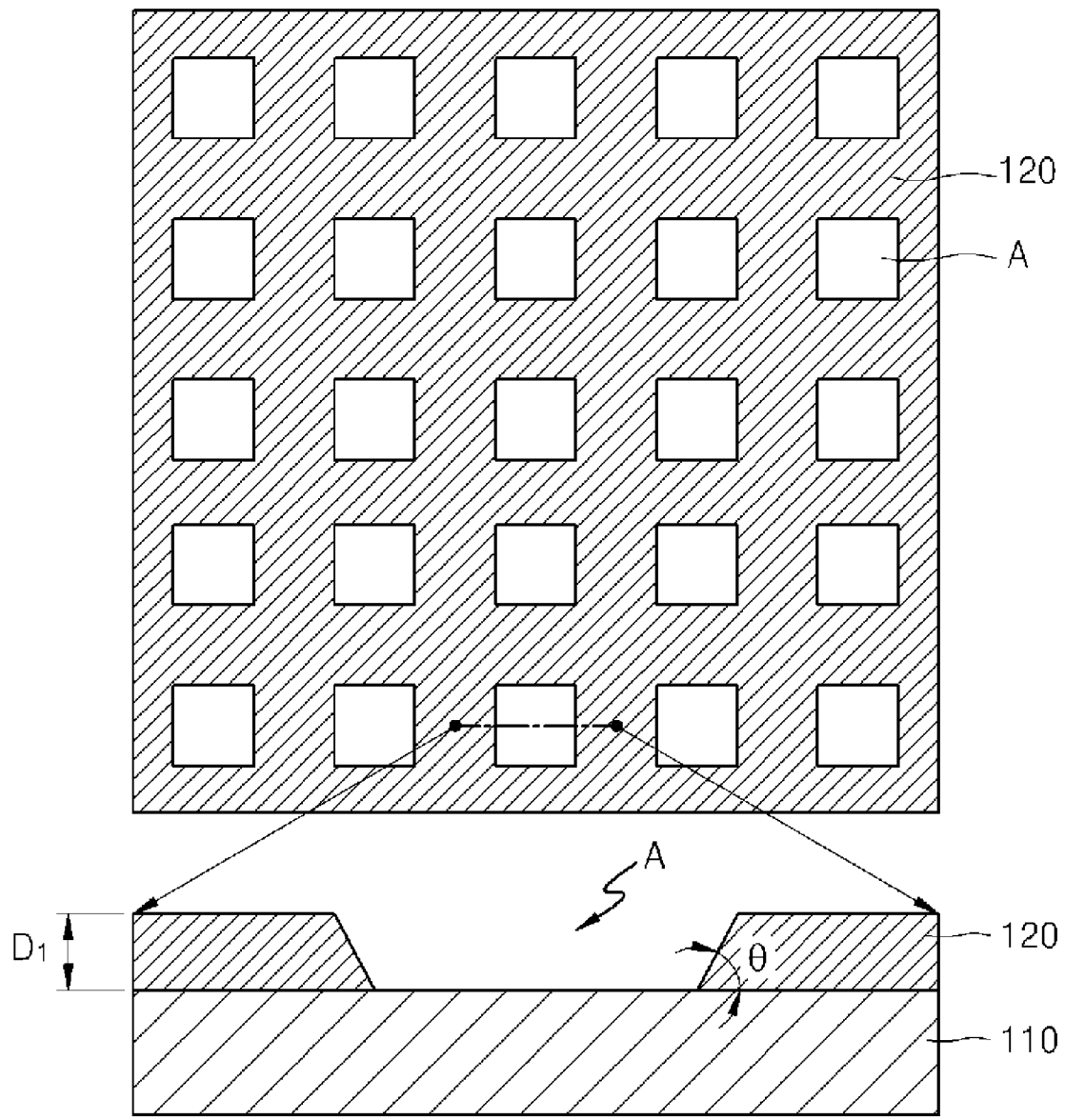
FIG. 2 shows a plan view and a cross-sectional view of a case where a first electrode layer is patterned on a substrate of FIG. 1, according to an embodiment of the present invention.

FIG. 2 shows a plan view and a cross-sectional view of a case where the first electrode layer 120 is patterned on the substrate 110 of FIG. 1, according to an embodiment of the present invention. Referring to FIG. 2, the first electrode layer 120 is formed in such a way that open grid-patterns 'A' with a predetermined thickness 'D1' are uniformly repeated.

A periodic interval between the patterns 'A' of the first electrode layer 120 may be several micrometers (μm), which is greater than a wavelength of light emitted from the organic light emitting device 100, thereby reducing wavelength dependence on visible light. The first electrode layer 120 may be easily patterned so as to have the periodic interval of several micrometers (μm) by etching the first electrode layer 120 by using a general photolithography method, however the invention is not limited thereto.

In FIG. 2, the open grid-patterns 'A' of the first electrode layer 120 each have a square shape, and are uniformly arranged, but the present invention is not limited thereto. That is, the open grid-patterns 'A' may each have various shapes other than a square shape, may each have various sizes, and may be arranged at various periods as long as the open grid-patterns 'A' are uniformly arranged.

In FIG. 2, the open grid-patterns 'A' of the first electrode layer 120 is completely opened by etching the first electrode layer 120 so that a surface of the substrate 110 is exposed, but the present invention is not limited thereto. The first electrode layer 120 is formed in such a way that an end of each of the open grid-patterns 'A' of the first electrode layer 120 tapers at a predetermined angle 'θ' with respect to a surface of the substrate 110, thereby increasing outcoupling efficiency, which will be described later in more detail.

While not required in all aspects, the predetermined angle θ is in the range of about 15 to about 90 degrees, and should be in the range of about 20 to about 70 degrees in many aspects of the invention.

After washing and plasma-cleaning are performed on the first electrode layer 120, the low refractive conductive layer 130 is formed on the first electrode layer 120 and the exposed portions of the substrate 110. The low refractive conductive layer 130 is formed of a conductive material having a lower refractive index than the refractive index of the organic layer 140. The low refractive conductive layer 130 may be formed of at least one selected from the group consisting of Poly(3, 4-ethylenedioxythiophene) poly(styrenesulfonate) (PEDOT: PSS), polyaniline, carbon nano tubes, and graphene, and may be formed using various methods such as a spin coating method.

The low refractive conductive layer 130 may have excellent conductivity and transparency, and may have a lower refractive index than that of the organic layer 140. In addition, charges may be easily injected from the low refractive conductive layer 130 to the organic layer 140.

According to the present embodiment, Dimethyl Sulfoxide (DMSO) is mixed with a PH500 solution available from the German HC Starck company, which includes a conductive polymer, PEDOT:PSS, and has a high-conductivity grade, in a volume rate of 5%, and then the mixture is coated on the low refractive conductive layer 130 by using a spin coating method. In this case, it is well known that the conductivity of the low refractive conductive layer 130 is in the range of about 200 to about 500 S/cm, surface resistivity of several hundreds of $\Omega$/sq is realized if the low refractive conductive layer 130 has a thickness of about 50 nm, and holes are easily injected from the low refractive conductive layer 130 to a hole transport type organic layer. In addition, a refractive index of the low refractive conductive layer 130 is in the range of about 1.3 to about 1.5 in a visible region, and is smaller than a refractive index of the organic layer 140, which is in the range of about 1.7 to about 1.8.

The organic layer 140 is formed on the low refractive conductive layer 130. In FIG. 1, the organic layer 140 is formed as a single layer, but the organic layer 140 may have a multi-layered structure, and may further include an inorganic material layer. The organic layer 140 may be formed of a small molecular weight organic material or a polymer organic layer.

When the organic layer 140 is formed of a small molecular weight organic material, the organic layer 140 may be formed by stacking an emission layer (EML) (not shown) and at least one selected from the group consisting of a hole injection layer (HIL) (not shown), a hole transport layer (HTL) (not shown), an EML, an electron transport layer (ETL) (not shown), and an electron injection layer (EIL) (not shown) in a multi-layered structure. An organic material used for forming the organic layer 140 may be copper phthalocyanine (CuPc), N,N'-Di(naphthalene-1-yl)-N,N'-diphenyl-benzidine (NPB), tris-8-hydroxyquinoline aluminum (Alq3), or the like. When the organic layer 140 is formed of a polymer organic material, the organic layer 140 may further include an HTL disposed between the organic layer 140 and an anode (not shown).

According to the present embodiment, the low refractive conductive layer 130 (that is, a PEDOT:PSS layer 130 that is a conductive layer having a low refractive index) may also function as the HIL. That is, the HIL may be formed of PEDOT:PSS, and the EML may be formed of a polymer organic material such as poly-phenylenevinylene (PPV), and polyfluorene. According to the present embodiment, the organic layer 140 is formed of NPB (50 nm) and Alq3 (50 nm) that is commonly used in a standard structure. In this case, the NPB (50 nm) operates as the HTL, and the Alq3 (50 nm) operates as the ETL and the EML, and the low refractive conductive layer 130 having the PEDOT:PSS acts as the HIL. In this case, it is understood that the layers 130 and 140 can be combined.

The second electrode layer 150 is formed on the organic layer 140. The second electrode layer 150 is a transparent electrode in the case of a top emission type device, or is a reflective electrode in the case of a bottom emission type device. When the second electrode layer 150 is a reflective electrode, the second electrode layer 150 may be formed of one selected from the group consisting of Li, Ca, LiF/Ca, LiF/Al, Al, Mg and combinations thereof. The second electrode layer 150 is configured as LiF (1 nm)/Al (100 nm).

Figure 3:
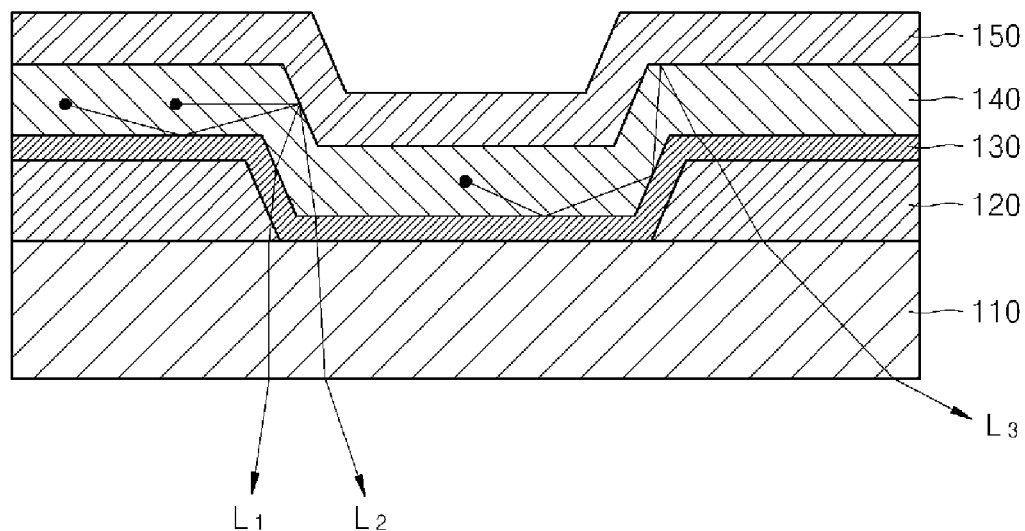
FIG. 3 is a cross-sectional view for illustrating an emissive mode of light beams emitted from the organic light emitting device of FIG. 1 by using a ray tracing method, according to an embodiment of the present invention.

FIG. 3 is a cross-sectional view for illustrating an emissive mode of light beams emitted from the organic light emitting device 100 of FIG. 1 by using a ray tracing method, according to an embodiment of the present invention. According to the present embodiment, the organic layer 140 is formed of NPB (50 nm) and Alq3 (50 nm). In this case, since NPB (50 nm) and Alq3 (50 nm) have almost the same refractive index, refraction occurring at a boundary between both of the materials is negligible. Thus, it is assumed that the organic layer 140 is formed of an optically single material, for convenience of description.

Referring to FIG. 3, it may be seen how light beams L1, L2 and L3 are changed to be of the emissive mode from among light beams emitted from the organic layer 140 (emissive material; Alq3) of the organic light emitting device 100. On the other hand, if the organic light emitting device 100 has a general structure, the light beams L1, L2 and L3 are emitted at a sufficiently horizontal angle so as to be of a waveguided mode. As shown in FIG. 3, since a refractive index of the organic layer 140 is greater than that of the low refractive conductive layer 130, the light beams L1, L2 and L3 are guided along the organic layer 140, and then are reflected by any structure so as to be changed to have a proceeding angle perpendicular to a surface of the structure. As a result, the light beams L1, L2 and L3 are changed to be of the emissive mode.

Figure 4:
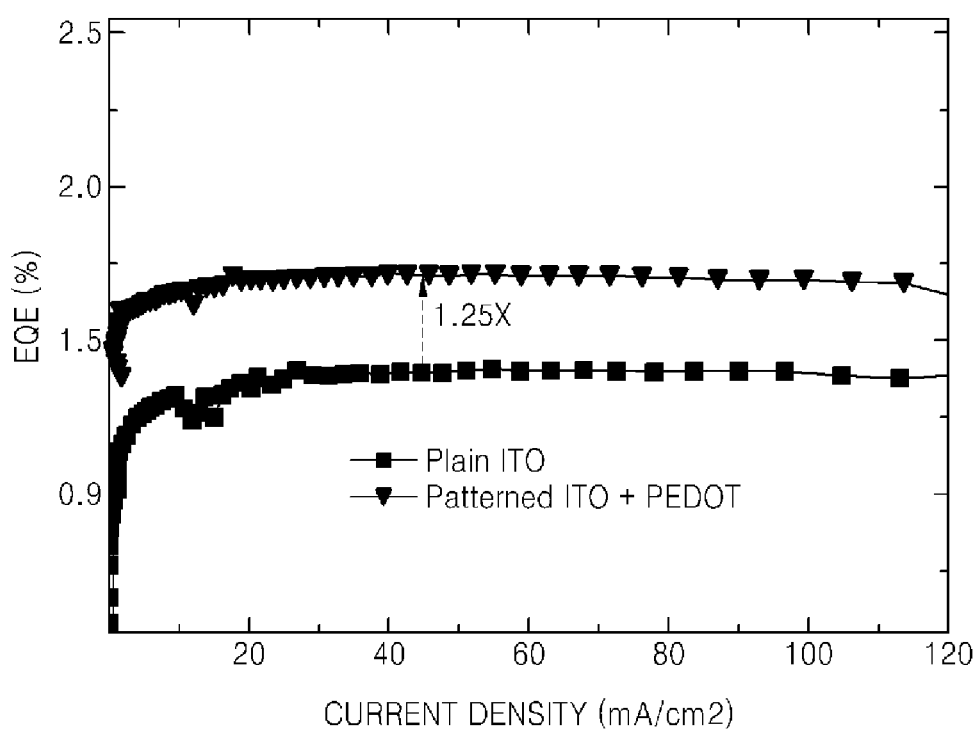
FIG. 4 is a graph for illustrating an increase in external quantum efficiency (EQE) of the organic light emitting device of FIG. 1, according to an embodiment of the present invention.
Figure 5:
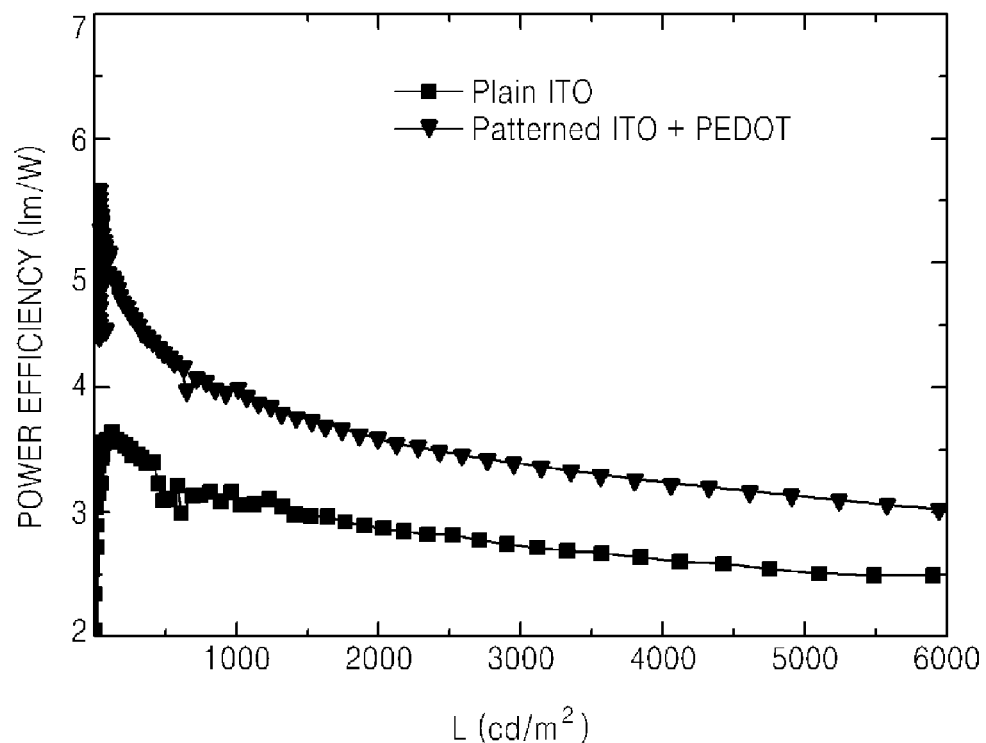
FIG. 5 is a graph for illustrating an increase in power efficiency of the organic light emitting device of FIG. 1, according to an embodiment of the present invention.

FIG. 4 is a graph for illustrating an increase in external quantum efficiency (EQE) of the organic light emitting device 100 of FIG. 1, according to an embodiment of the present invention. FIG. 5 is a graph for illustrating an increase in power efficiency of the organic light emitting device 100 of FIG. 1, according to an embodiment of the present invention.

The organic light emitting device 100 includes the first electrode layer 120 formed of indium tin oxide (ITO). The open grid-patterns 'A' of the first electrode layer 120 has a square shape with a size of 3 µm×3 µm and a periodic interval of 6 µm. The low refractive conductive layer 130 is formed of PH500 to which 5% of DMSO (in terms of volumetric ratio) is added. Referring to FIGS. 4 and 5, the EQE and the power efficiency of the organic light emitting device 100 are about 1.25 times higher than that of an organic light emitting device including plain ITO. This value was measured with respect to a structure in which the taper angle 'θ' of the organic light emitting device 100 having patterned ITO is not optimized, and the taper angle 'θ' was measured as an angle in the range of about 20 to about 30 degrees from a scanning electron microscope (SEM) image of the organic light emitting device 100. Thus, when the taper angle 'θ' is optimized, performance of the organic light emitting device 100 may be improved, which will be described later.

U.S. Patent Publication No. 2008/0238310A1 discloses an array that has a low refractive index and is disposed on an ITO electrode in order to improve outcoupling efficiency of a device. In this array, since a low refractive array formed of an insulating material is disposed on the ITO electrode, a region where the low refractive array is disposed corresponds to an inactive electrical area. In this case, since an actual current density for realizing valid brightness is relatively high, currents are concentrated in a unit area, thereby reducing the lifetime of the device, increasing an operating voltage, and decreasing power efficiencies. However, according to the present embodiment, the organic light emitting device 100 includes the low refractive conductive layer 130 disposed between the first electrode layer 120 (i.e., the patterned ITO layer) and the organic layer 140, and thus light may be emitted from an entire portion of the organic light emitting device 100 where the low refractive conductive layer 130 is formed without the inactive electrical area.

When a surface resistance of the ITO used for forming the first electrode layer 120 is R(ITO), a surface resistance of PH500 used for forming the low refractive conductive layer 130 is R(PH500), and a total surface resistance of the ITO and the PH500 is R(TOTAL). R(TOTAL) of ITO/PH500 of the organic light emitting device 100 may be defined by Equation 1, in consideration of the shape and periodic interval of the patterns of the first electrode layer 120.

$$R^{(TOTAL)} = \frac{1}{2}R^{(ITO)} + \left(\frac{1}{R^{(ITO)}} + \frac{1}{R^{(PEDOT)}}\right)^{-1} \quad (1)$$

With respect to a thickness of 50 nm, R(PH500) is about 50 Ω/sq, R(ITO) is about 10 Ω/sq, R(PEDOT) is 500 Ω/sq, and R(TOTAL) is about 14.8 Ω/sq. Thus, it may be seen that the increase in resistance is not high. Thus, even if a lighting apparatus or an organic light emitting display apparatus using the organic light emitting device 100 according to the present embodiment have a large size, a reduction in brightness due to a voltage drop IR is not great compared to an organic light emitting device having the plain ITO. Thus, in the case of the lighting apparatus or organic light emitting display apparatus using the organic light emitting device 100, the outcoupling efficiency may be improved, and simultaneously, the reduction in brightness due to the voltage drop IR may be prevented.

Accordingly, the power efficiency and lifetime of the organic light emitting device 100 may be increased by reducing inactive electrical areas. In addition, since the size and periodic interval of the patterns are sufficiently large compared to a wavelength at a visible region, wavelength dependence on visible light may be reduced, and outcoupling efficiency may be improved.

Figure 6:
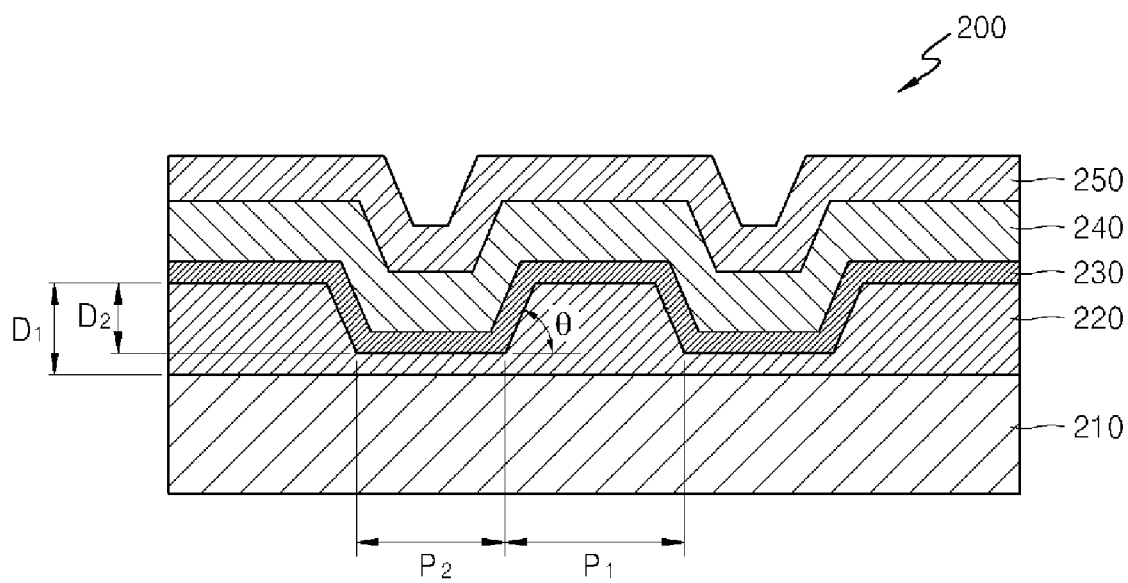
FIG. 6 is a cross-sectional view of an organic light emitting device according to another embodiment of the present invention.

FIG. 6 is a cross-sectional view of an organic light emitting device 200 according to another embodiment of the present invention. Hereinafter, the organic light emitting device 200 will be described in terms of differences from the organic light emitting device 100 according to the above-described embodiment. Referring to FIG. 6, the organic light emitting device 200 includes a substrate 210, a first electrode layer 220, a low refractive conductive layer 230, an organic layer 240, and a second electrode layer 250.

In the organic light emitting device 200, the first electrode layer 220 is uniformly patterned on the substrate 210. The pattern of the first electrode layer 220 includes a first pattern portion P1 formed in an upper surface of the substrate 210 so as to have a first thickness D1, and a second pattern portion P2 etched in an upper surface of the first pattern portion P1 towards the substrate 210 so as to have a thickness D2. In the organic light emitting device 100 according to the above-described embodiment, the open grid-patterns 'A' of the first electrode layer 120 are completely etched so as to expose a surface of the substrate 110, and thus a ratio (D2/D1) of the second thickness D2 with respect to the first thickness D1 is 1. However, in the organic light emitting device 200 according to the present embodiment, a ratio (D2/D1) of the second thickness D2 with respect to the first thickness D1 is smaller than 1.

In addition, in the organic light emitting device 200 according to the present embodiment, a taper angle 'θ' between an end of the second pattern portion P2 of the first electrode layer 220 and a surface of the first pattern portion P1 may be in the range of about 15 to about 90 degrees, for example, about 20 to about 70 degrees. As the ratio (D2/D1) of the second thickness D2 to the first thickness D1 is increased (that is, an etching degree is further increased), a range of the taper angle 'θ' for increasing outcoupling efficiency is increased, which will be described below with reference to FIG. 7.

Figure 7:
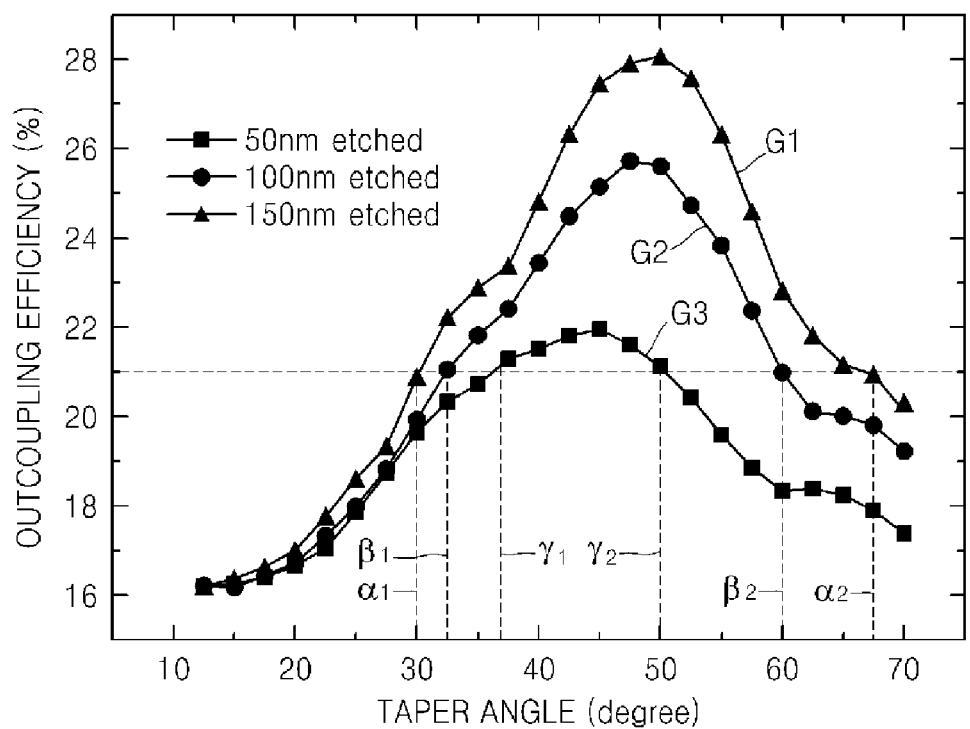
FIG. 7 is a graph for illustrating outcoupling efficiency of the organic light emitting device of FIG. 6 according to a taper angle and etching rate of a first electrode layer, according to an embodiment of the present invention.

FIG. 7 is a graph for illustrating outcoupling efficiency of the organic light emitting device 200 according to a taper angle θ and etching rate of the first electrode layer 220 of FIG. 6, according to an embodiment of the present invention. Referring to FIG. 7, when the first thickness D1 of the first pattern portion P1 is 150 nm, as the thickness D2 of an etched portion of the second pattern portion P2 of the first electrode layer 220 is increased (that is, in the order G3<G2<G1), the outcoupling efficiency of the organic light emitting device 200 is increased. Thus, from an outcoupling efficiency point of view, it is advantageous that the second pattern portion P2 of the first electrode layer 220 is completely etched.

However, according to the present embodiment, although the second pattern portion P2 of the first electrode layer 220 is not completely etched (in cases of G2 and G3), an efficient range of outcoupling efficiency may be maintained by adjusting the taper angle 'θ'. For example, in order to obtain an excellent outcoupling efficiency of 21% or more which is an increase of 31% compared to 16% of outcoupling efficiency of a reference device (a general structure having plain ITO), the taper angle θ is in the range of α1 to α2 in the case of G1 in which the second pattern portion P2 of the first electrode layer 220 is completely etched. In the case of G2 in which the second pattern portion P2 of the first electrode layer 220 is etched by ⅔ of the first pattern portion P1, the taper angle is in the range of β1 to β2. In the case of G3 in which the second pattern potion P2 of the first electrode layer 220 is etched by ⅓ of the first patterned portion P1, the taper angle is in the range of γ1 to γ2. That is, as an etching degree is further increased, a range of the taper angle for increasing the outcoupling efficiency is increased.

While not required in all aspects, in the shown example, α1 is roughly 30° and α2 is roughly 66°; β1 is roughly 32° and β2 is roughly 60°; and γ1 is roughly 36° and γ2 is roughly 50°.

Thus, the outcoupling efficiency may be improved by determining an optimum range of the taper angle θ from the graph of FIG. 7. In addition, even if the second pattern portion P2 of the first electrode layer 120 is not completely etched, a desired outcoupling efficiency may be obtained by selecting an optimum range of the taper angle θ.

The first pattern portion P1 and the second pattern portion P2 may be formed so as to have various patterns, such as grid type patterns. A periodic interval between the first pattern portion P1 and the second pattern portion P2 may be several micrometers (μm) that is greater than a wavelength of light emitted from the organic light emitting device 200, thereby reducing wavelength dependence of visible region.

The low refractive conductive layer 230 is formed of a conductive material having a lower refractive index than that of the organic layer 240. The low refractive conductive layer 230 and the second electrode layer 250 are formed on the first electrode layer 220. The low refractive conductive layer 230 and the second electrode layer 250 are the same as the low refractive conductive layer 130 and the second electrode layer 150 of FIG. 1, respectively, and thus details thereof will not be repeated.

Figure 8:
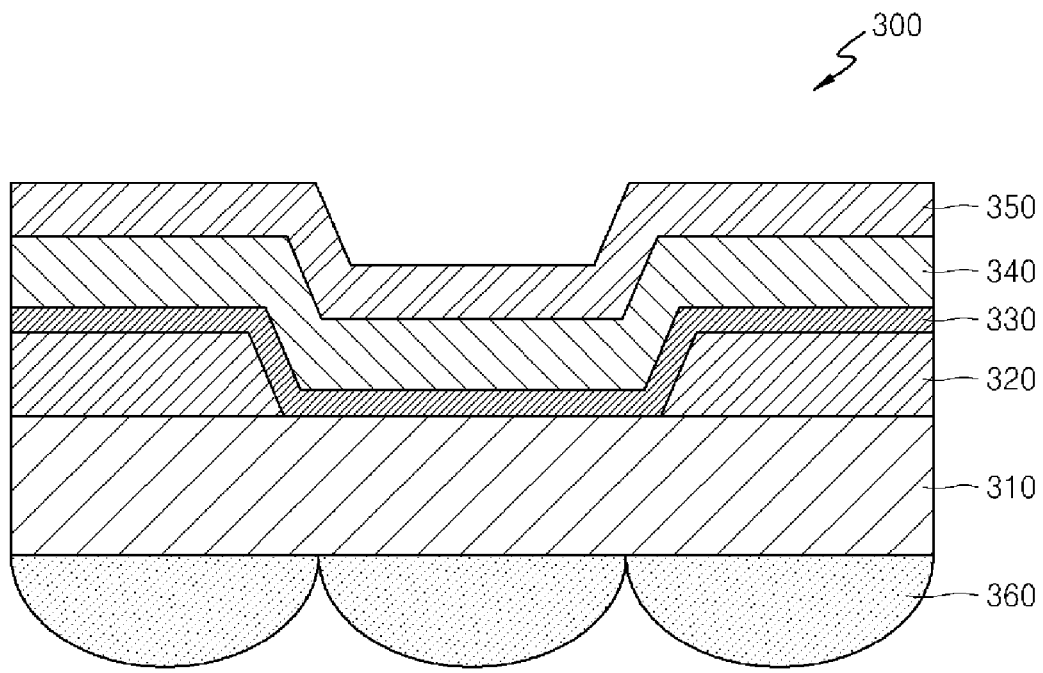
FIG. 8 is a cross-sectional view of an organic light emitting device according to another embodiment of the present invention.

FIG. 8 is a cross-sectional view of an organic light emitting device 300 according to another embodiment of the present invention. Hereinafter, the organic light emitting device 300 will be described in terms of differences between it and the organic light emitting device 100 of FIG. 1. Referring to FIG. 8, the organic light emitting device 300 includes a substrate 310, a first electrode layer 320, a low refractive conductive layer 330, an organic layer 340, a second electrode layer 350, and a microlens array (MLA) 360.

According to the present embodiment, the organic light emitting device 300 includes the MLA 360 disposed on an external surface of the substrate 310. The MLA 360 may have at least one shape selected from the group consisting of a hemispherical shape, a pyramid shape and an inverted-trapezoid shape. The MLA 360 may include at least one material selected from the group consisting of an oxide, a nitride, a silicon compound and polymer organic material that are transparent to visible rays. The MLA 360 may be formed on or attached onto the substrate 310. If necessary, the MLA 360 may be formed by patterning the substrate 310 by using a mechanical method or an etching method.

The MLA 360 may be formed to have a periodic pattern. The size or period interval of the patterns of the MLA 360 are greater than a wavelength of light emitted from the organic light emitting device 300, thereby reducing wavelength dependence of visible region.

Figure 9:
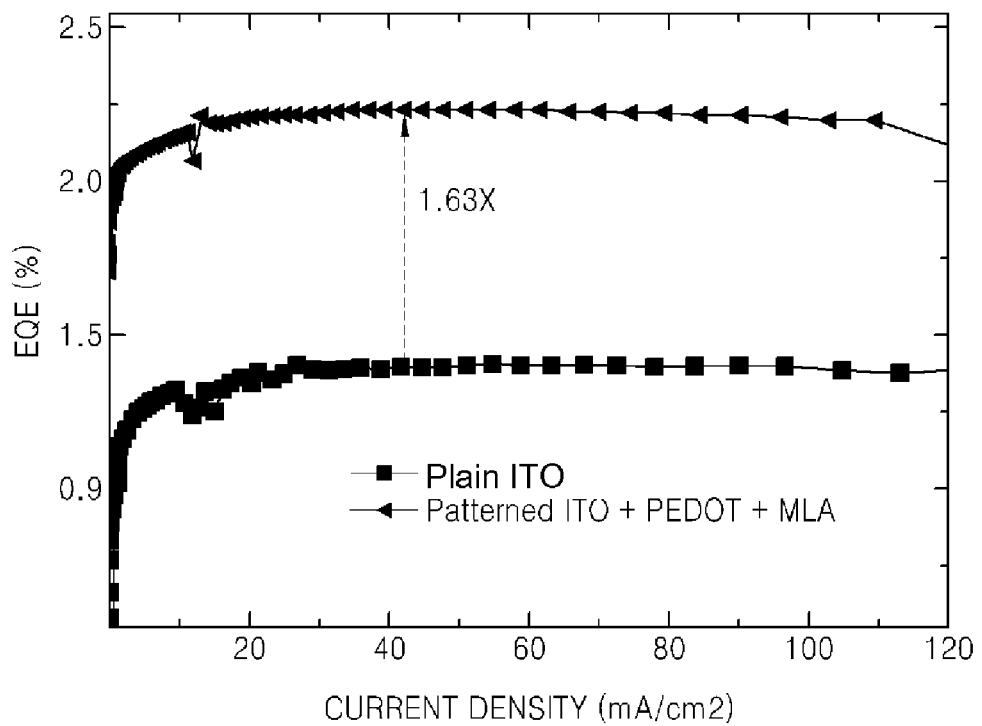
FIG. 9 is a graph for illustrating an increase in EQE of the organic light emitting device of FIG. 8, according to another embodiment of the present invention.
Figure 10:
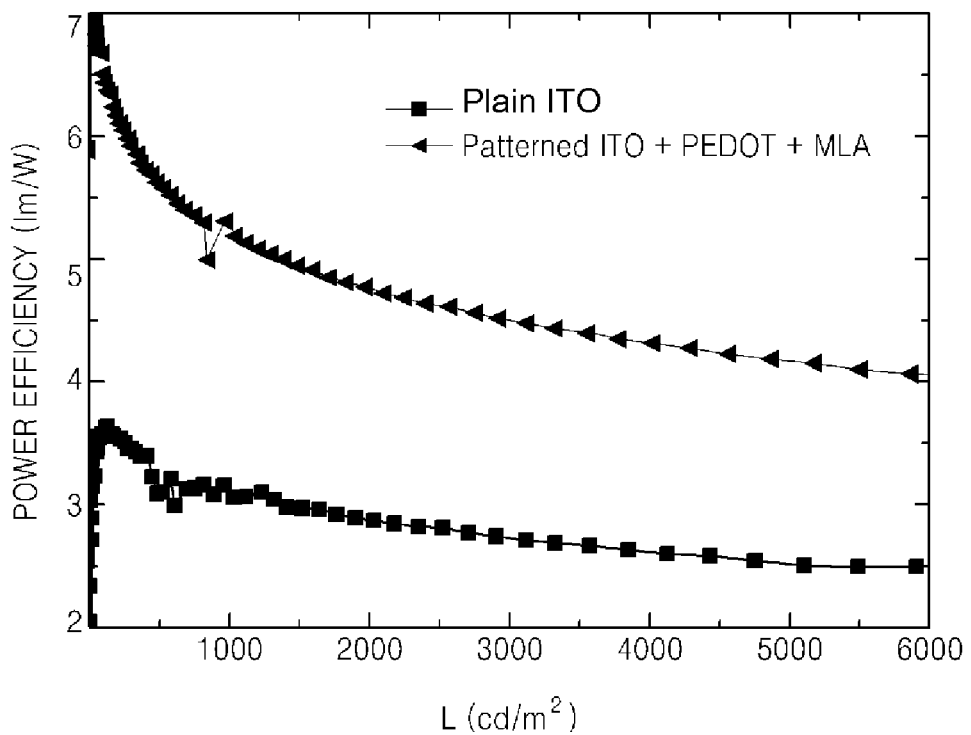
FIG. 10 is a graph for illustrating an increase in power efficiency of the organic light emitting device of FIG. 8, according to another embodiment of the present invention.

FIG. 9 is a graph for illustrating an increase in EQE of the organic light emitting device 300 of FIG. 8, according to another embodiment of the present invention. FIG. 10 is a graph for illustrating an increase in power efficiency of the organic light emitting device 300 of FIG. 8, according to another embodiment of the present invention.

Referring to FIGS. 9 and 10, the EQE and the power efficiency of the organic light emitting device 300 are about 1.63 times higher than that of an organic light emitting device including plain ITO. The organic light emitting device 300 includes the first electrode layer 320 having patterned ITO, the low refractive conductive layer 330 (e.g., PEDOT:PSS) formed on the first electrode layer 320, and the MLA 360 formed on the external surface of the substrate 310. This value was measured with respect to a structure in which the taper angle 'θ' of the organic light emitting device 300 having patterned ITO is not optimized. Thus, when the taper angle 'θ' is optimized, performance of the organic light emitting device 300 may be improved, which will be described later.

According to the present embodiment, the substrate 300 having a refractive index with an optimum range may be used in order to improve the outcoupling efficiency of the organic light emitting device 300. In this case, the MLA 360 may be formed of the same material as or similar to that of the substrate 310, but the invention is not limited thereto.

Figure 11:
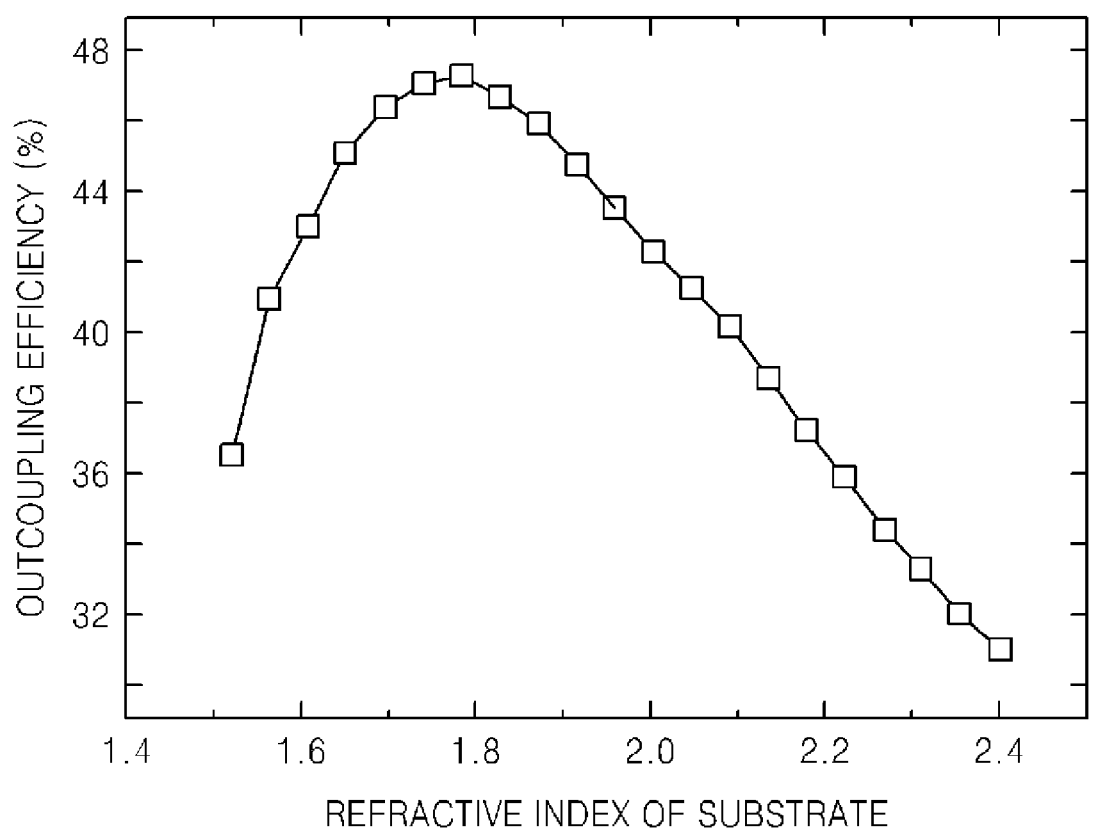
FIG. 11 is a graph for illustrating a relationship between a substrate refractive index and outcoupling efficiency in an organic light emitting device including a microlens array (MLA) having the same refractive index as that of a substrate.

FIG. 11 is a graph for illustrating a relationship between a substrate refractive index and outcoupling efficiency when the taper angle of the pattern of the first electrode layer 320 is 25 degrees in the organic light emitting device 300 including the MLA 360 having the same refractive index as that of the substrate 310. Referring to FIG. 11, when the refractive index of the MLA 360 is about 1.7 to about 1.9, which is similar to that of the organic layer 340 or the first electrode layer 320, the outcoupling efficiency may be maximized. However, a substrate 310 having a high refractive index may be more expensive than a general substrate, and thus the MLA 360 may be appropriately selected in consideration of manufacturing costs and manufacturing properties of the organic light emitting device 300. As shown in FIG. 11, when a general substrate having a refractive index of about 1.52 is used, the efficiency may be increased by 100% or more (an increase from about 16% to about 36%) by using a structure of the organic light emitting device 300.

According to the embodiments of the present invention, an organic light emitting device, a lighting apparatus and organic light emitting display apparatus including the organic light emitting device may include a MLA, and thus outcoupling efficiency may be efficiently improved.

Thus, the lifetime of the organic light emitting device is not reduced due to inactive electrical areas, and thus the outcoupling efficiency of the organic light emitting device may be improved, and simultaneously power efficiency may be maintained, thereby increasing the lifetime of the organic light emitting device. In addition, the organic light emitting device has improved outcoupling efficiency with little wavelength dependence.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting device comprising:
a substrate;
a first electrode layer that is uniformly patterned on the substrate;
a low refractive conductive layer disposed on the first electrode layer, the low refractive conductive layer comprising a conductive material;
an organic layer on the low refractive conductive layer, the conductive material having a lower refractive index than a refractive index of the organic layer; and
a second electrode layer formed on the organic layer.

2. The organic light emitting device of claim 1, wherein at least one of the first electrode layer or the second electrode layer comprises a transparent electrode.

3. The organic light emitting device of claim 1, wherein a periodic interval of a pattern of the first electrode layer is greater than a wavelength of light emitted from the organic light emitting device.

4. The organic light emitting device of claim 1, wherein a taper angle between an end of a pattern of the first electrode layer and a surface of the substrate is from about 15 to about 90 degrees.

5. The organic light emitting device of claim 1, wherein a taper angle between an end of a pattern of the first electrode layer and a surface of the substrate from about 20 to about 70 degrees.

6. The organic light emitting device of claim 1, wherein a pattern of the first electrode layer comprises a first pattern portion formed at an upper surface of the substrate to have a first thickness, and a second pattern portion formed by etching an upper surface of the first pattern portion towards the substrate so as to have a second thickness,
wherein the first pattern portion and the second pattern portion are uniformly arranged.

7. The organic light emitting device of claim 6, wherein a periodic interval of the first pattern portion and the second pattern portion is greater than a wavelength of light emitted from the organic light emitting device.

8. The organic light emitting device of claim 6, wherein a taper angle between an end of the second pattern portion and a surface of the first pattern portion is from about 15 to about 90 degrees.

9. The organic light emitting device of claim 6, wherein a taper angle between an end of the second pattern portion and a surface of the first pattern portion is from about 20 to about 70 degrees.

10. The organic light emitting device of claim 8, wherein, as a ratio of the second thickness to the first thickness is increased, a range of the taper angle is increased.

11. The organic light emitting device of claim 1, wherein the low refractive conductive layer is transparent.

12. The organic light emitting device of claim 1, wherein the low refractive conductive layer has a high work function.

13. The organic light emitting device of claim 1, wherein the low refractive conductive layer comprises at least one selected from the group consisting of Poly(3,4-ethylenedioxythiophene) poly(styrenesulfonate) (PEDOT:PSS), polyaniline, carbon nano tubes, and graphene.

14. The organic light emitting device of claim 1, further comprising a microlens array (MLA) disposed on an external surface of the substrate.

15. The organic light emitting device of claim 14, wherein the MLA has at least one shape selected from the group consisting of a hemispherical shape, a pyramid shape and an inverted-trapezoid shape.

16. The organic light emitting device of claim 14, wherein the MLA has a pattern having a periodic interval.

17. The organic light emitting device of claim 14, wherein a size or periodic interval of the MLA is greater than a wavelength of light emitted from the organic light emitting device.

18. The organic light emitting device of claim 14, wherein the MLA comprises at least one material selected from the group consisting of an oxide, a nitride, a silicon compound and a polymer organic material, which are transparent to visible rays.

19. The organic light emitting device of claim 14, wherein the MLA is formed of a material having a same refractive index as a refractive index of the substrate.

20. The organic light emitting device of claim 14, wherein the substrate has a greater refractive index than a refractive index of a sodalime-based substrate.

21. The organic light emitting device of claim 20, wherein a refractive index of the substrate is from of about 1.5 to about 2.4.

22. A lighting apparatus comprising the organic light emitting device of claim 1.

23. An organic light emitting display apparatus comprising the organic light emitting device of claim 1.

24. An organic light emitting device comprising:
a substrate;
an electrode layer comprising a conductive multi-layer having a pattern and disposed above the substrate;
an organic layer covering the pattern; and
another electrode disposed above the organic layer and covering the pattern,
wherein the conductive multi-layer comprises a conductive layer with a different refractive index than a refractive index of the organic layer to form a waveguide to waveguide light emitted by the organic layer in a direction substantially parallel to the substrate and to reflect the waveguided light towards the substrate using the pattern.

25. The organic light emitting device of claim 24, wherein the pattern comprises an open grid pattern comprising etched portions, adjacent pairs of the etched portions being separated by a distance that is greater than a wavelength of the light emitted from the organic layer.

26. The organic light emitting device of claim 25, wherein each of the etched portions forms a surface which is at an angle relative to the substrate, and the angle corresponds to an outcoupling efficiency of the organic light emitting device.

27. The organic light emitting device of claim 26, wherein the outcoupling efficiency of the organic light emitting device is at least 21%.

28. The organic light emitting device of claim 25, wherein each of the etched portions forms a surface which is at an angle relative to the substrate, and the angle is at or between 30° and 66°.

29. The organic light emitting device of claim 26, wherein each of the etched portions has a depth which is less than a thickness of the electrode layer.

30. The organic light emitting device of claim 29, wherein the angle corresponds to the depth of the etched portions.

31. The organic light emitting device of claim 24, wherein the conductive layer is disposed adjacent the organic layer.

32. The organic light emitting device of claim 31, wherein the conductive layer further functions as a hole injection layer used in the organic layer in emitting the light.

33. The organic light emitting device of claim 25, wherein, at each etched portion, the another electrode extends towards the substrate and forms a reflective surface at an angle relative to the substrate which reflects the waveguided light towards the substrate.

34. The organic light emitting device of claim 33, wherein the angle corresponds to an outcoupling efficiency of the organic light emitting device.

* * * * *

UNITED STATES PATENT AND TRADEMARK OFFICE
CERTIFICATE OF CORRECTION

PATENT NO. : 8,410,477 B2  
APPLICATION NO. : 12/952348  
DATED : April 2, 2013  
INVENTOR(S) : Sung-Hun Lee et al.

Page 1 of 1

It is certified that error appears in the above-identified patent and that said Letters Patent is hereby corrected as shown below:

In the Claims

Column 10, Claim 5, line 48      Insert -- is --  
After "substrate"

Column 11, Claim 10, line 7      Delete "a range of"

Column 11, Claim 10, line 7      Delete "increased"  
Insert -- decreased --

Signed and Sealed this  
Fourteenth Day of April, 2015

Michelle K. Lee  
*Director of the United States Patent and Trademark Office*